United States Patent
Nagai et al.

(10) Patent No.: US 9,660,124 B2
(45) Date of Patent: May 23, 2017

(54) CONCENTRATOR PHOTOVOLTAIC UNIT, CONCENTRATOR PHOTOVOLTAIC MODULE, CONCENTRATOR PHOTOVOLTAIC PANEL, AND CONCENTRATOR PHOTOVOLTAIC APPARATUS

(71) Applicant: Sumitomo Electric Industries, Ltd., Osaka-shi (JP)

(72) Inventors: Youichi Nagai, Osaka (JP); Koji Mori, Osaka (JP); Kazumasa Toya, Osaka (JP); Takashi Iwasaki, Osaka (JP); Makoto Inagaki, Osaka (JP); Yoshiki Kuhara, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 122 days.

(21) Appl. No.: 14/619,856

(22) Filed: Feb. 11, 2015

(65) Prior Publication Data

US 2015/0243821 A1 Aug. 27, 2015

(30) Foreign Application Priority Data

Feb. 24, 2014 (JP) ................................ 2014-032973

(51) Int. Cl.
*H01L 31/0232* (2014.01)
*H01L 31/054* (2014.01)
(Continued)

(52) U.S. Cl.
CPC ........ *H01L 31/0543* (2014.12); *H01L 31/048* (2013.01); *H02S 20/32* (2014.12); *Y02E 10/52* (2013.01)

(58) Field of Classification Search
None
See application file for complete search history.

(56) References Cited

U.S. PATENT DOCUMENTS

| 2004/0089338 A1* | 5/2004 | Kukulka | H01L 27/142 136/251 |
| 2004/0211459 A1* | 10/2004 | Suenaga | H01L 31/02021 136/244 |

(Continued)

FOREIGN PATENT DOCUMENTS

JP 2006-313809 A 11/2006

*Primary Examiner* — Magali P Slawski
(74) *Attorney, Agent, or Firm* — Venable LLP; Michael A. Sartori; Laura G. Remus

(57) ABSTRACT

A concentrator photovoltaic unit being an optical system base unit includes: a concentrating portion configured to converge sunlight; a cell configured to receive light converged by the concentrating portion to generate power; a package including a frame portion, the frame portion having insulating property and surrounding the cell, the package being in integrated relation with the cell; a shield plate provided between the concentrating portion and the cell, and including an opening allowing light converged by the concentrating portion to selectively pass therethrough; and a protection plate being a heat-resistant member provided on the frame portion to make the cell expose to the light and to shield the package, the protection plate being in contact with nothing but the frame portion, and securing a predetermined insulation distance from a live portion of the cell.

9 Claims, 11 Drawing Sheets

(51) Int. Cl.
*H02S 20/32* (2014.01)
*H01L 31/048* (2014.01)

(56) References Cited

U.S. PATENT DOCUMENTS

| | | | | |
|---|---|---|---|---|
| 2004/0263976 | A1* | 12/2004 | Harata | B60R 5/044 359/543 |
| 2010/0307563 | A1* | 12/2010 | Vilella | H02S 20/10 136/246 |
| 2014/0069490 | A1* | 3/2014 | Alboiez | H01L 31/02008 136/255 |
| 2015/0083193 | A1* | 3/2015 | Ueda | H01L 31/02168 136/246 |

* cited by examiner

CONCENTRATOR PHOTOVOLTAIC UNIT, CONCENTRATOR PHOTOVOLTAIC MODULE, CONCENTRATOR PHOTOVOLTAIC PANEL, AND CONCENTRATOR PHOTOVOLTAIC APPARATUS

TECHNICAL FIELD

The present invention relates to a concentrator photovoltaic (CPV) unit, a concentrator photovoltaic module, a concentrator photovoltaic panel, and a concentrator photovoltaic apparatus, each for generating power by concentrating sunlight on a cell.

BACKGROUND ART

In a unit being an optical system base unit for a concentrator photovoltaic, a concentrating portion composed of a Fresnel lens forms a light spot by converging sunlight to be guided to a small cell, whereby power is generated. For such a cell, a solar cell having a high power generating efficiency and heat resisting property is used. Such a configuration allows much light energy to be concentrated onto a small cell, whereby power can be generated with high efficiency. A large number of such concentrator photovoltaic units are arranged in a matrix shape to form a concentrator photovoltaic module, and then, a large number of the modules are arranged in a matrix shape to form a concentrator photovoltaic panel. The concentrator photovoltaic panel forms a concentrator photovoltaic apparatus, together with a driving device for causing the panel to perform tracking operation while facing the sun.

In order to accurately direct the light spot onto the small cell, it is necessary to cause the concentrating portion to always and accurately face the sun, to allow sunlight to be incident on the concentrating portion in parallel to the optical axis of the concentrating portion, at an incidence angle of 0 degrees. However, actually, due to deviation in tracking operation and variation in accuracy of parts, there are cases that the incidence angle is not 0 degrees. Since the concentrator photovoltaic panel does not track the sun during night time, there are cases where, at first in the morning, tracking operation is delayed for the power generation and the incidence angle is not 0 degrees.

When such an incidence deviation angle occurs, power generating efficiency is reduced, and strong light strikes the vicinity of the cell, thereby causing early degradation of the material of that portion.

Thus, it has been proposed to provide a homogenizer (pillar-shaped optical member) for guiding light to the cell even with the presence of a slight deviation angle (for example, see PATENT LITERATURE 1 (FIG. 4)). It has also been proposed to provide a shield plate between the concentrating portion and the cell in addition to the homogenizer, to suppress strong light from striking the vicinity of the cell.

CITATION LIST

Patent Literature

PATENT LITERATURE 1: Japanese Laid-Open Patent Publication No. 2006-313809

SUMMARY OF INVENTION

Technical Problem

However, the homogenizer is an expensive optical member, and use of a large number of the homogenizers makes the concentrator photovoltaic apparatus very expensive. Thus, the homogenizer poses a big problem in terms of costs. Apart from the issue of taking measures for absorbing deviation in the incidence angle, it is desired to at least avoid early degradation of the vicinity of the cell due to such deviation.

In view of the above problem, an object of the present invention is to provide, for a concentrator photovoltaic, a highly practical structure that delays degradation, of the material in the vicinity of the cell, that could be caused when the incidence angle is deviated from 0 degrees.

Solution to Problem

A concentrator photovoltaic unit of the present invention includes: a concentrating portion configured to converge sunlight; a cell configured to receive light converged by the concentrating portion to generate power; a package including a frame portion, the frame portion having insulating property and surrounding the cell, the package being in integrated relation with the cell; a shield plate provided between the concentrating portion and the cell, and including an opening allowing light converged by the concentrating portion to selectively pass therethrough; and a protection plate being a heat-resistant member provided on the frame portion to make the cell expose to the light and to shield the package, the protection plate being in contact with nothing but the frame portion, and securing a predetermined insulation distance from a live portion of the cell.

By use of the above concentrator photovoltaic unit, a concentrator photovoltaic module/panel/apparatus can be formed.

Advantageous Effects of Invention

According to the concentrator photovoltaic unit of the present invention, it is possible to provide a highly practical structure that delays degradation, of the material in the vicinity of the cell, that could be caused when an incidence deviation angle has occurred.

The same applies to the concentrator photovoltaic module/panel/apparatus that includes the units.

BRIEF DESCRIPTION OF DRAWINGS

FIG. 2 shows one example of a concentrator photovoltaic system including a driving device and the like;

FIG. 6A and FIG. 6B are perspective views each showing a protection plate and a package including a cell, in which FIG. 6A shows an exploded state, and FIG. 6B shows an assembled state;

DESCRIPTION OF EMBODIMENTS

Summary of Embodiment

Figure 1:
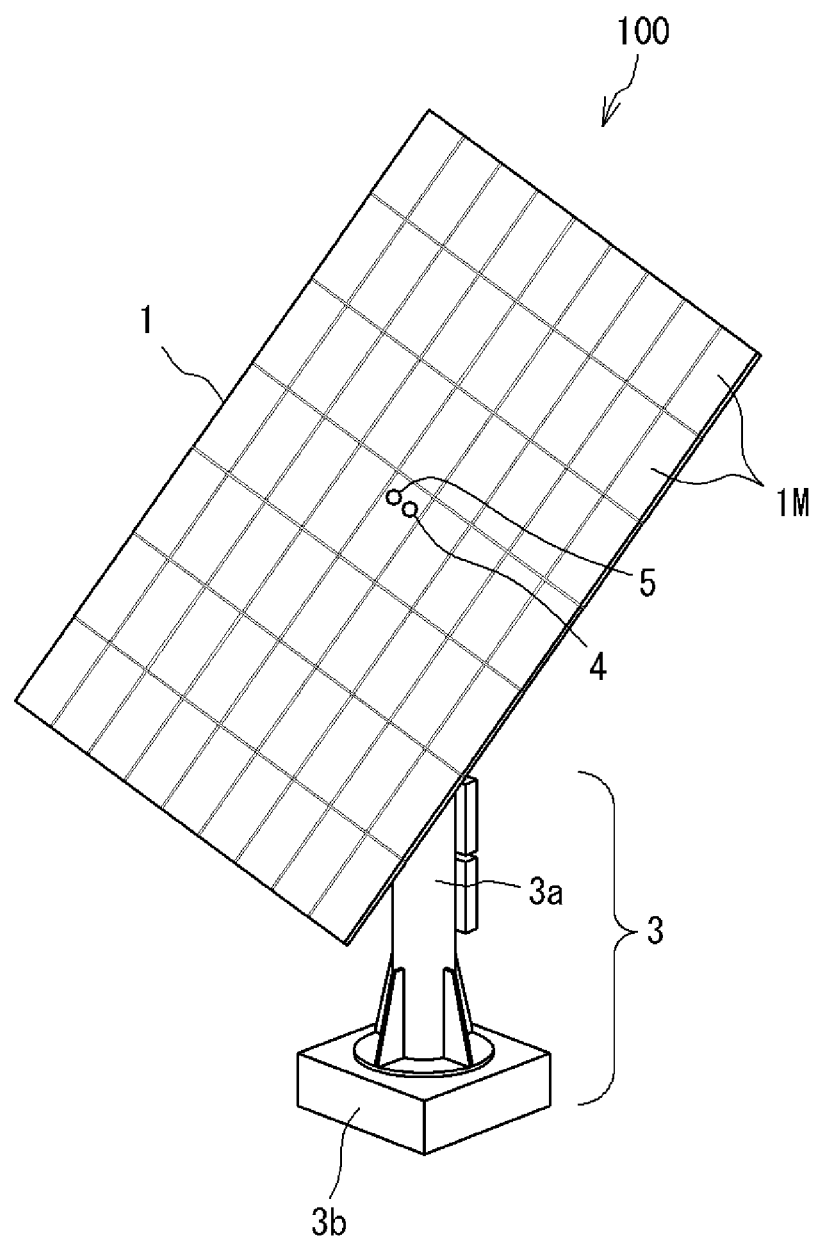
FIG. 1 is a perspective view showing one example of a concentrator photovoltaic apparatus.

The summary of the embodiment of the present invention includes at least the following.

(1) This concentrator photovoltaic unit includes: a concentrating portion configured to converge sunlight; a cell configured to receive light converged by the concentrating portion to generate power; a package including a frame portion, the frame portion having insulating property and surrounding the cell, the package being in integrated relation with the cell; a shield plate provided between the concentrating portion and the cell, and including an opening allowing light converged by the concentrating portion to selectively pass therethrough; and a protection plate being a heat-resistant member provided on the frame portion to make the cell expose to the light and to shield the package, the protection plate being in contact with nothing but the frame portion, and securing a predetermined insulation distance from a live portion of the cell.

In the concentrator photovoltaic unit configured as (1) above, in a case where the incident angle of sunlight relative to the concentrating portion has a deviation angle from 0 degrees, of light that has passed through the shield plate, the part that does not strike the cell strikes the protection plate. In this case, since the protection plate is a heat-resistant member, the protection plate can sufficiently endure the heat of converged light. In addition, since the protection plate keeps a predetermined insulation distance from the live portion and is in an electrically suspended (insulated) state because of being in contact with nothing but the frame portion, discharge from the live portion can be prevented. That is, the protection plate is a highly practical member suitable for stable use.

Therefore, it is possible to provide a highly practical structure that delays degradation, of the material in the vicinity of the cell, that could be caused in a case where an incidence deviation angle has occurred.

(2) In the concentrator photovoltaic unit according to (1), preferably, the protection plate is a plate-like member having an opening configured to expose the cell, and an inner end surface of the opening is a tapered surface formed such that an area of the opening on a light exit side is smaller than an area of the opening on a light entrance side.

Such a tapered surface serves to reflect light having struck the tapered surface, to guide the light to the cell. Accordingly, the tapered surface contributes to concentrating more light on the cell.

(3, 4) In the concentrator photovoltaic unit according to (1) or (2), the protection plate may be made of a metal or a ceramic.

In this case, advantages depending on the selected materials can be obtained. Metal is inexpensive and excellent in strength. Ceramics are less likely to be deformed by heat, and creeping discharge seldom occurs.

By use of a metal or a ceramic, although depending on the material thereof, light can be reflected at a certain rate even when light has struck the protection plate, and thus, increase in temperature of the protection plate, and the frame portion of the package which is in contact with the protection plate can also be suppressed.

(5) In the concentrator photovoltaic unit according to (2), the protection plate may be a resin plate whose surface is coated with a metal, or a ceramic plate whose surface is coated with a metal, a metal coating layer being formed at least on the tapered surface and a surface on which light strikes.

In this case, the resin plate coated with a metal is inexpensive and light in weight. In addition, the resin plate coated with a metal and the ceramic plate coated with a metal reflect light having struck them, at the metal coating layers. In particular, since the metal coating layer is formed also on the tapered surface, the tapered surface can reflect light that has struck the tapered surface, to guide the light to the cell.

(6) A concentrator photovoltaic module is formed by arranging a plurality of the concentrator photovoltaic units according to (1) in a housing and by mutually electrically connecting the concentrator photovoltaic units.

(7) A concentrator photovoltaic panel is formed by arranging a plurality of the concentrator photovoltaic modules according to (6).

(8) A concentrator photovoltaic apparatus includes the concentrator photovoltaic panel according to (7), and a driving device configured to drive the concentrator photovoltaic panel to thereby perform operation of tracking movement of the sun while facing a direction of the sun.

Details of Embodiment

Hereinafter, details of the embodiment of the present invention will be described with reference to the drawings.

<<Concentrator Photovoltaic Apparatus/Concentrator Photovoltaic Panel>>

First, a configuration of a concentrator photovoltaic apparatus will be described.

FIG. 1 is a perspective view showing one example of the concentrator photovoltaic apparatus. In FIG. 1, a concentrator photovoltaic apparatus 100 includes a concentrator photovoltaic panel 1, and a pedestal 3 which includes a post 3a and a base 3b thereof, the post 3a supporting the concentrator photovoltaic panel 1 on the rear surface thereof. The concentrator photovoltaic panel 1 is formed by assembling a large number of concentrator photovoltaic modules 1M vertically and horizontally. In this example, 62 (7 in length×9 in breadth−1) concentrator photovoltaic modules 1M are assembled vertically and horizontally, except the center portion. When one concentrator photovoltaic module 1M has a rated output of, for example, about 100 W, the entirety of the concentrator photovoltaic panel 1 has a rated output of about 6 kW.

On the rear surface side of the concentrator photovoltaic panel 1, a driving device (not shown) is provided, and by operating this driving device, it is possible to drive the concentrator photovoltaic panel 1 into axes of the azimuth and the elevation. Accordingly, the concentrator photovoltaic panel 1 is driven so as to always face the direction of the sun in both of the azimuth and the elevation. At a place (in this example, the center portion) on the concentrator photovoltaic panel 1, or in the vicinity of the panel 1, a tracking sensor 4 and a pyrheliometer 5 are provided. Operation of tracking the sun is performed, relying on the tracking sensor 4 and the position of the sun calculated from the time, the latitude, and the longitude of the installation place.

That is, every time the sun has moved by a predetermined angle, the driving device drives the concentrator photovoltaic panel 1 by the predetermined angle. The event that the sun has moved by the predetermined angle may be determined by the tracking sensor 4, or may be determined by the latitude, the longitude, and the time. Thus, there are also cases where the tracking sensor 4 is omitted. The predetermined angle is, for example, a constant value, but the value may be changed in accordance with the altitude of the sun and the time.

Figure 2:
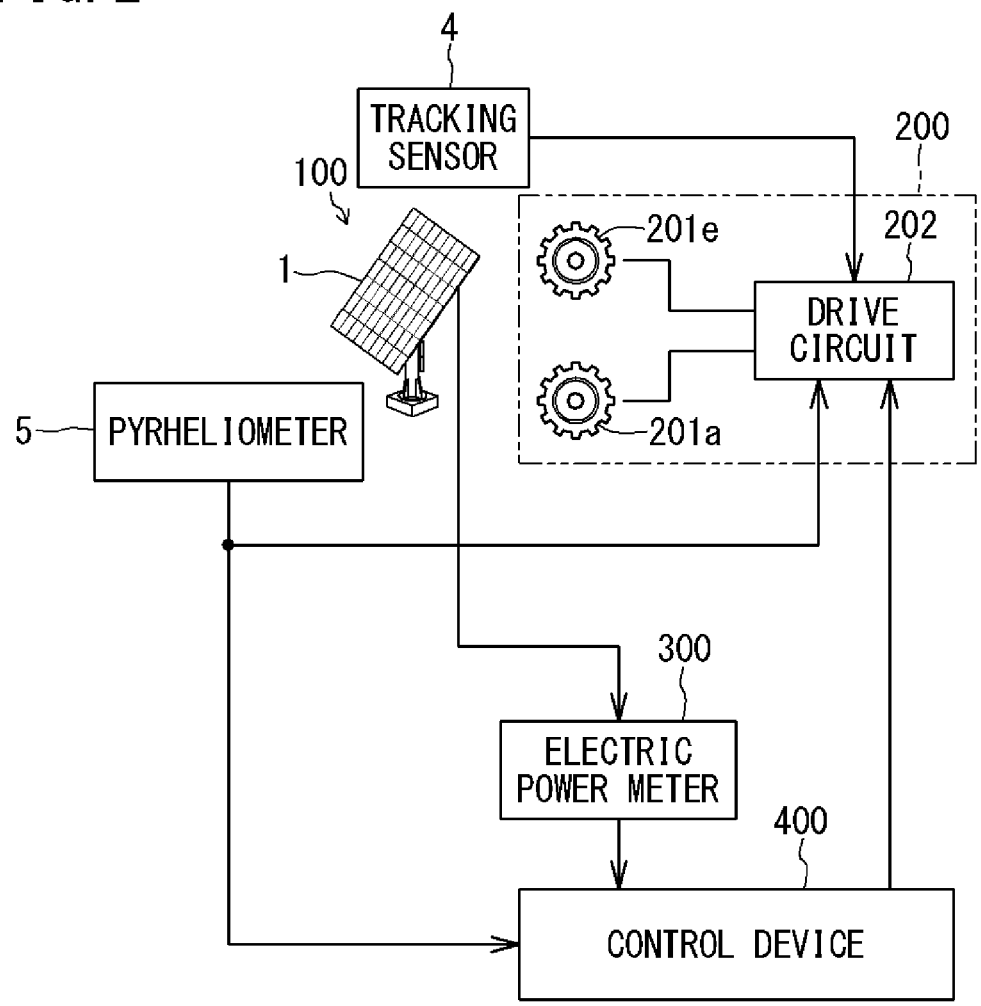

FIG. 2 shows one example of a concentrator photovoltaic system including the driving device and the like. This figure is expressed from the viewpoint of control of tracking operation. In FIG. 2, as described above, the concentrator photovoltaic apparatus 100 includes a driving device 200 for operation of tracking the sun on the rear surface side thereof, for example. The driving device 200 includes a stepping motor 201e for driving into the elevation direction, a stepping motor 201a for driving into the azimuth direction, and a drive circuit 202 which drives these. It should be noted that the stepping motors are merely examples and another power source may be used.

An output signal (direct solar irradiance) from the pyrheliometer 5 is inputted to the drive circuit 202 and a control device 400. Generated power of the concentrator photovoltaic panel 1 can be sensed by an electric power meter 300, and a signal indicating the sensed electric power is inputted to the control device 400. The driving device 200 stores the latitude and the longitude of the installation place of the concentrator photovoltaic panel 1, and also has a function of a clock. Based on an output signal from the tracking sensor 4 and the position of the sun calculated from the latitude, the longitude, and the time, the driving device 200 causes tracking operation to be performed such that the concentrator photovoltaic panel 1 always faces the sun. However, as described above, there are cases where the tracking sensor 4 is not provided. In such a case, tracking operation is performed based on only the position of the sun calculated from the latitude, the longitude, and the time.

<<Concentrator Photovoltaic Module>>

Figure 3:
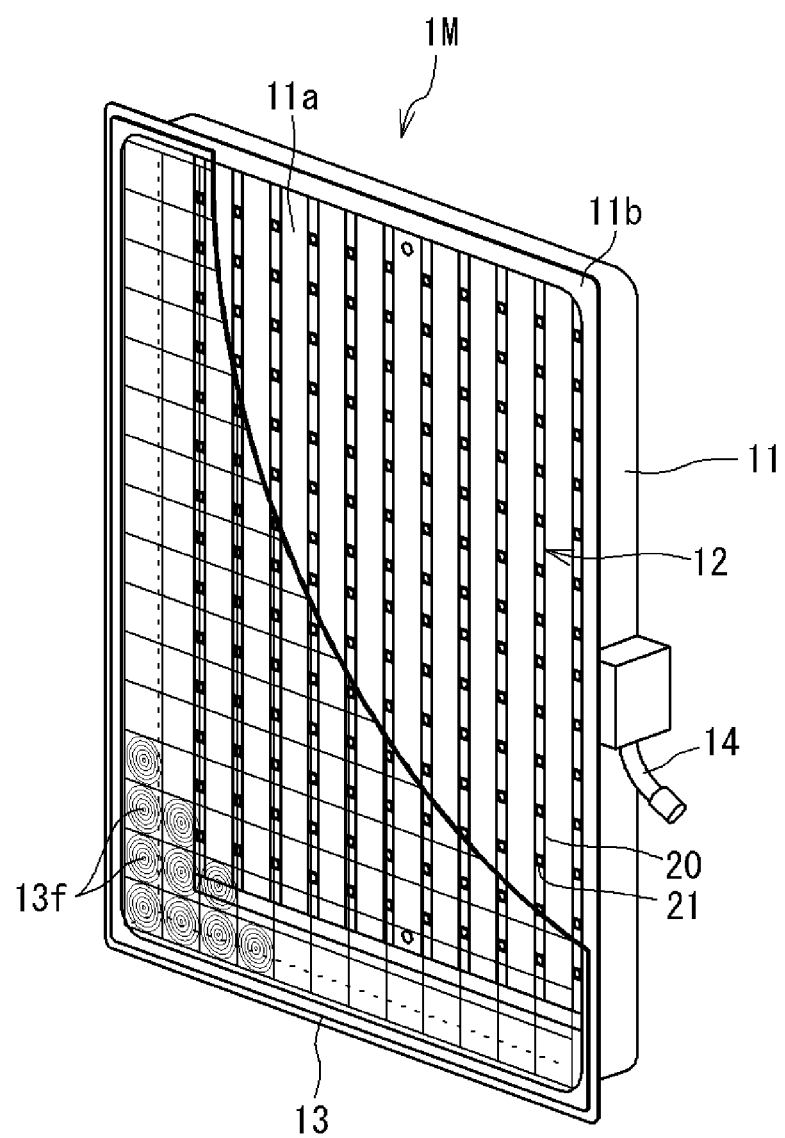
FIG. 3 is a perspective view (partially cut out) showing an enlarged view of one example of a concentrator photovoltaic module.

FIG. 3 is a perspective view (partially cut out) showing an enlarged view of one example of the concentrator photovoltaic module (hereinafter, also simply referred to as module) 1M (however, a shield plate described later is not shown here). In FIG. 3, the module 1M includes as main components: a housing 11 formed in a vat shape and having a flat bottom surface 11a; a flexible printed circuit 12 provided in contact with the bottom surface 11a; and a concentrating portion 13 attached, like a cover, to a flange portion 11b of the housing 11. The housing 11 is made of a metal.

The flexible printed circuit 12 is obtained by providing a pattern on an elongated flexible printed substrate 20 and by mounting cells 21 and other electric parts thereon. As each cell 21, a solar cell having a high power generating efficiency and heat resisting property is used.

It should be noted that the flexible printed substrate is merely one example, and another kind of substrate can be used. For example, a large number of resin substrates or a large number of ceramic substrates each having a flat plate shape (rectangular shape or the like) may be used.

The concentrating portion 13 is a Fresnel lens array and is formed by arranging, in a matrix shape, a plurality of (for example, 16 in length×12 in breadth, 192 in total) Fresnel lenses 13f which concentrate sunlight. The concentrating portion 13 can be obtained by, for example, forming a silicone resin film on the back surface (inside) of a glass plate used as a base material. Each Fresnel lens 13f is formed on this resin film. The total number and arrangement of the Fresnel lenses 13f are the same as the total number and arrangement of the cells 21 such that the Fresnel lenses 13f and the cells 2l are arranged in one-to-one correspondence while their optical axes are aligned with each other. On the external surface of the housing 11, a connector 14 for taking out an output from the module 1M is provided.

Figure 4:
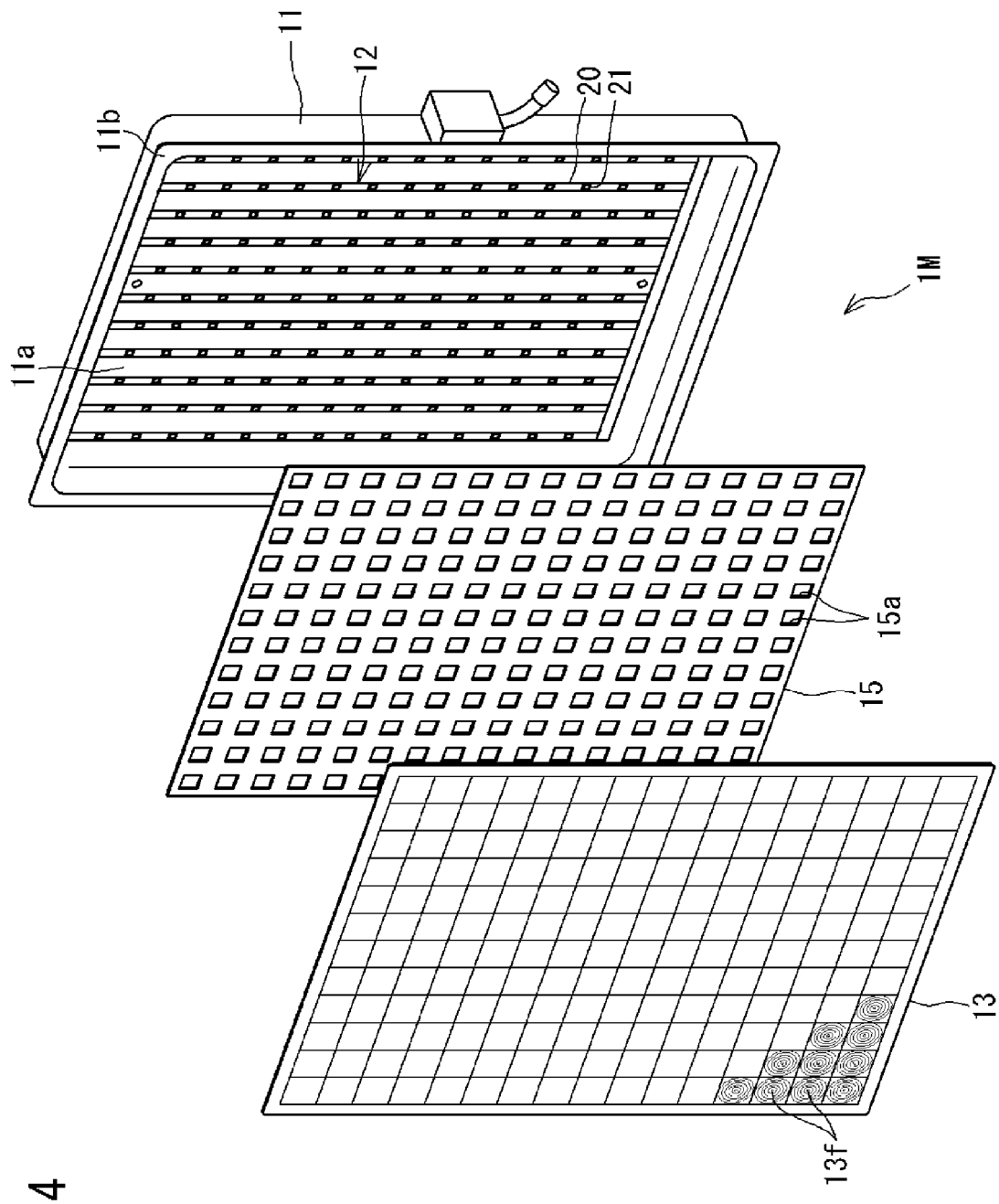
FIG. 4 is an exploded perspective view of the concentrator photovoltaic module.

FIG. 4 is an exploded perspective view of the module 1M. Although not shown in FIG. 3, a shield plate 15 made of a metal (for example, an aluminium alloy) is provided between the concentrating portion 13 and the cells 21, and is supported by the housing 11. In the shield plate 15, openings 15a having the same number and the same arrangement as those of Fresnel lenses 13f and of the cells 21 are formed. Light converged by each Fresnel lens 13f passes through its corresponding opening 15a and reaches its corresponding cell 21. The shield plate 15 has a function of allowing converging light to pass therethrough, and of preventing weak ambient light around the converging light and irregular reflection inside the module 1M from affecting the cell 21.

<<Concentrator Photovoltaic Unit>>

Figure 5:
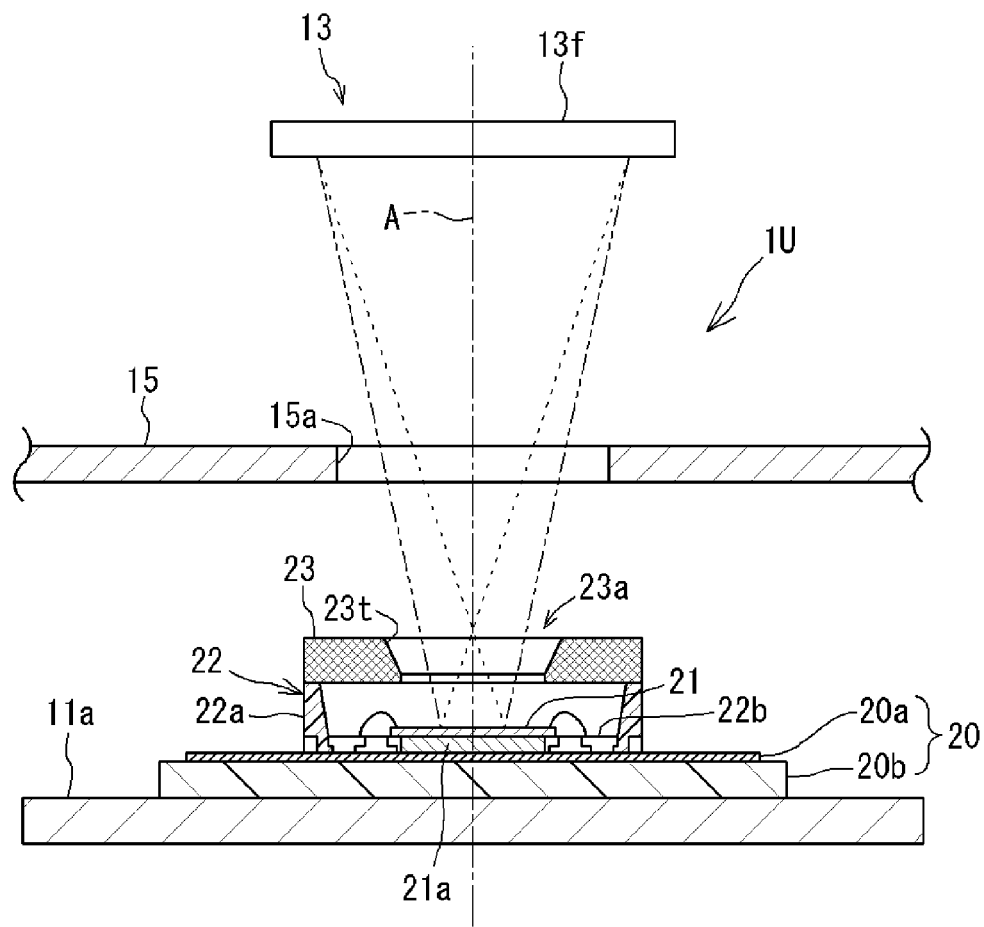
FIG. 5 is a schematic diagram showing a concentrator photovoltaic unit as an optical system base unit forming the concentrator photovoltaic module.

Next, FIG. 5 is a schematic diagram showing a concentrator photovoltaic unit (hereinafter, also simply referred to as "unit") 1U as an optical system base unit forming the above module 1M. It should be noted that the dimensions of each component and the distance between the components are not necessarily uniformly to scale. In the unit 1U, sunlight concentrated by Fresnel lens 13f of the concentrating portion 13 passes through the opening 15a in the shield plate 15, to form a light spot on the cell 21. Accordingly, the cell 21 generates power. The cell 21 is formed by a semiconductor material and converts light energy into electric energy, and thus, heat generation thereof is suppressed. In addition, through heat conduction to a package 22 and the bottom surface 11a, heat generation from the cell 21 is suppressed.

In the lowest part of FIG. 5, there depicted is the bottom surface 11a of the housing 11 (FIG. 3). On the bottom surface 11a, the flexible printed substrate 20 is provided. The flexible printed substrate 20 includes an insulation base material 20b and a pattern 20a being an electric conductor formed thereon. The cell 21 has a lead frame 21a being an output terminal, and the lead frame 21a is electrically connected to a predetermined portion of the pattern 20a.

The cell 21 is in the relation of being mutually integrated with the package 22 which is formed of a resin being an insulation material. The package 22 is composed of a bottom portion 22b holding the cell 21, and a frame portion 22a surrounding the cell. On the frame portion 22a, a protection plate 23 is provided. The protection plate 23 has an opening 23a of a square shape. The protection plate 23 is provided on the frame portion 22a so as to expose the cell 21 (through the opening 23a) to light coming from the opening 15a of the shield plate 15, and so as to shield the package 22.

The protection plate 23 is in contact with nothing but the frame portion 22a and secures a predetermined insulation distance from a live portion (an energized portion such as lead frame 21a) of the cell 21. The predetermined insulation distance is a distance that does not cause discharge (corona discharge and creeping discharge) at the maximum voltage of the live portion. When a large number of cells 21 are connected to each other in series, the voltage to ground of the live portion reaches a maximum of 1000 V, for example. The insulation distance depends on the height of the frame portion 22a. Since the protection plate 23 keeps the predetermined insulation distance from the live portion and is in an electrically suspended state by being in contact with nothing but the frame portion, discharge from the live portion can be prevented. Thus, in terms of prevention of discharge, the protection plate 23 is a highly practical member suitable for stable use.

Figure 6A:
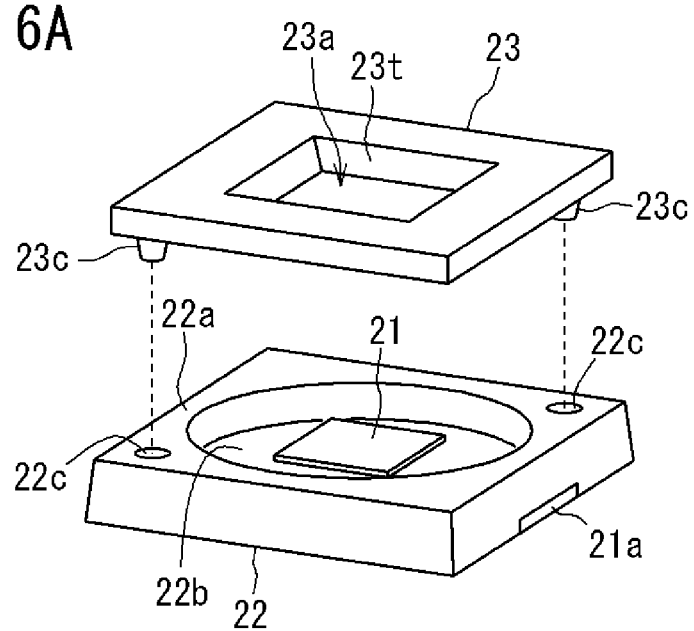
Figure 6B:
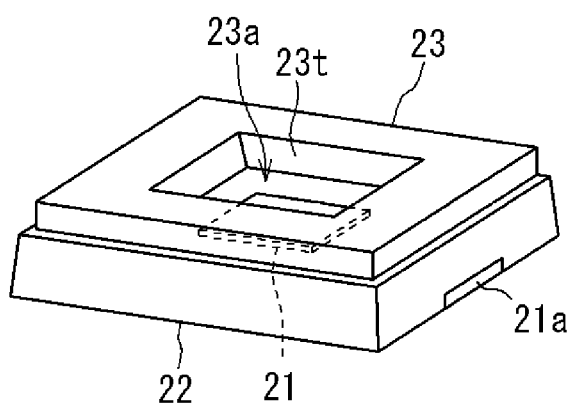

FIG. 6A and FIG. 6B are perspective views each showing the package 22 including the cell 21, and the protection plate 23, in which FIG. 6A shows an exploded state, and FIG. 6B shows an assembled state. As shown in FIG. 6A, holes 22c are respectively formed at two places on the upper surface of the frame portion 22a of the package 22. In addition, projections 23c are formed on the surface, of the protection plate 23, that faces these holes 22c. When the projections 23c are respectively inserted into the holes 22c to perform positioning, and at the same time, the projections 23c and the holes 22c are bonded to each other, the protection plate 23 can be attached to the package 22 easily and accurately.

Figure 7:
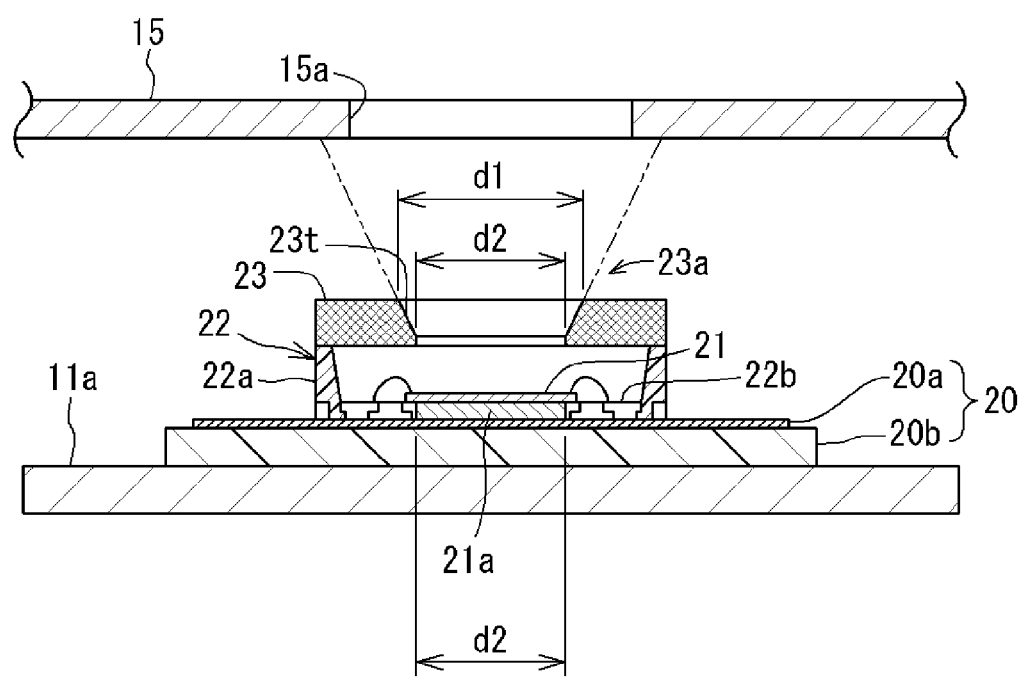
FIG. 7 shows a part of FIG. 5.

FIG. 7 shows a part of FIG. 5. With respect to the opening 23a of the protection plate 23, a dimension d2 on the light exit side is smaller than a dimension d1 on the light entrance side. That is, the inner end surface of the opening 23a is a tapered surface 23t formed such that the area of the opening on the light exit side is smaller than the area of the opening on the light entrance side. The effective light receiving surface of the cell 21 is also square, and the dimension of one side of the square is substantially the same as the dimension d2 above. The opening 15a of the shield plate 15 is present inside the positions where extension lines from the slopes of the tapered surface 23t cross the shield plate 15. This relation contributes to prevention of diffraction of light that occurs, for example, when light having passed through the opening 15a strikes portions other than the cell 21.

It is also conceivable that the opening 15a of the shield plate 15 is made narrow so as to allow only light that is incident at an incidence angle of 0 degrees and converged by the Fresnel lens 13f, to pass through the opening 15a. However, in such a configuration, even a slight deviation angle will cause loss of light energy, which is not preferable. That is, it is preferable to allow light with a slight deviation angle to pass through the opening 15a.

As a material of the protection plate 23, a metal such as an aluminium alloy or the like can be used. Such a metal has sufficient heat resisting property against concentrated light. Moreover, metal is inexpensive and excellent in strength. In addition, as described above, the protection plate 23 is supported in a state of securing the insulation distance and being electrically suspended, and thus, discharge can be prevented.

With reference back to FIG. 5, the optical axis A of the Fresnel lens 13f passes the center of the opening 15a and the center of the opening 23a, and crosses the center of the cell 21. When tracking of the sun is being accurately performed, sunlight in parallel to the optical axis A of the Fresnel lens 13f is incident, and light converging as indicated by chain double-dashed lines, for example, reaches the cell 21. It is also possible that, as indicated by dotted lines, light that has once been converged at the focal point is allowed to slightly diffuse to form a light spot, and the light spot is then caused to reach the cell 21.

Figure 8:
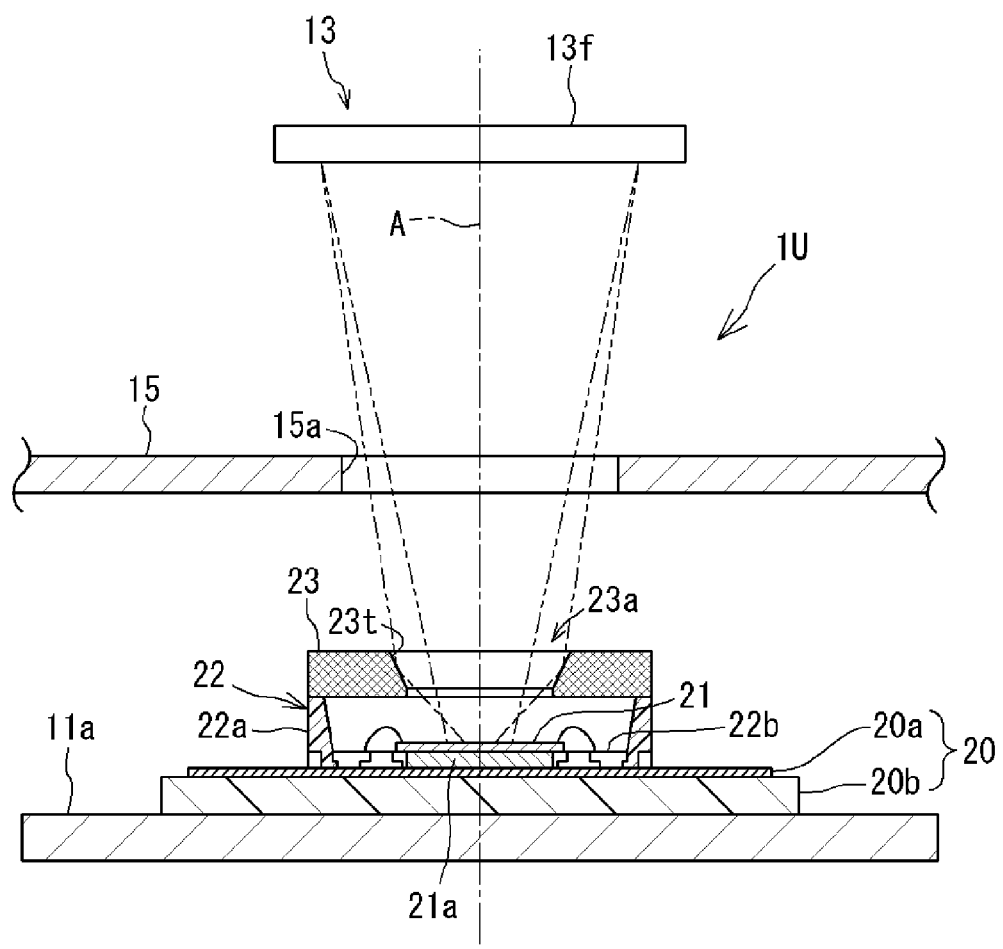
FIG. 8 shows one example of the path of light when sunlight having, due to deviation in tracking, a deviation angle from an incidence angle of 0 degrees relative to the optical axis of a Fresnel lens is incident on the Fresnel lens.

FIG. 8 shows one example of the path of light when sunlight having, due to deviation in tracking, a deviation angle from an incidence angle of 0 degrees relative to the optical axis A is incident on the Fresnel lens 13f. At this time, the tapered surface 23t being the inner end surface of the opening 23a serves to reflect light having struck the tapered surface 23t, to guide the light to the cell 21. Accordingly, the tapered surface 23t contributes to concentrating more light on the cell 21.

Although the protection plate 23 is made of a metal in the above description, the protection plate 23 may be made of a ceramic. In this case, the protection plate 23 made of a ceramic is less likely to be deformed by heat, and creeping discharge seldom occurs.

By use of a metal or a ceramic, although depending on the material thereof, light can be reflected at a certain rate even when light has struck the protection plate 23, and thus, increase in temperature of the protection plate 23, and the frame portion 22a of the package 22 which is in contact with the protection plate 23 can also be suppressed.

The protection plate 23 may be a resin plate whose surface is coated with a metal (aluminium or silver thin film coating), or a ceramic plate whose surface is coated with a metal, a metal coating layer being formed at least on the tapered surface 23t and a surface (upper surface) which light strikes. In this case, the resin plate coated with a metal is inexpensive and light in weight. In addition, the resin plate coated with a metal and the ceramic plate coated with a metal reflect light having struck them, at the metal coating layers. In particular, since the metal coating layer is formed also on the tapered surface 23t, the tapered surface 23t can reflect light that has struck the tapered surface 23t, to guide the light to the cell 21.

As the material of the protection plate 23, a heat-resistant glass having light blocking effect can also be used.

Figure 9:
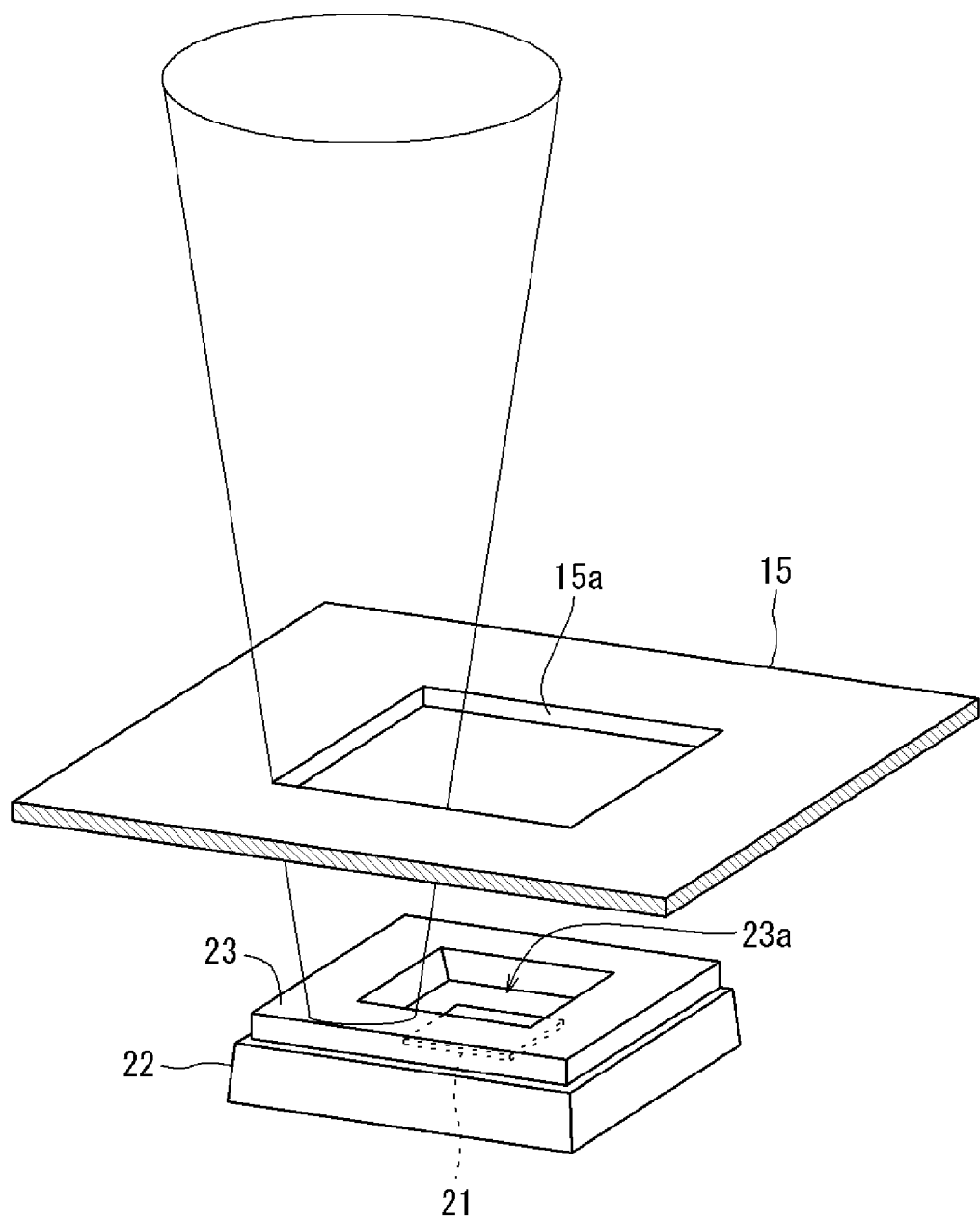
FIG. 9 is a perspective view showing one example of a case where deviation of the incidence angle of sunlight has been further increased.

FIG. 9 is a perspective view showing one example of a case where deviation of the incidence angle of sunlight has been further increased. In this case, converging light passes through the opening 15a of the shield plate 15 but is not included within the opening 23a of the protection plate 23, and a part of the light spot strikes the protection plate 23.

Figure 10:
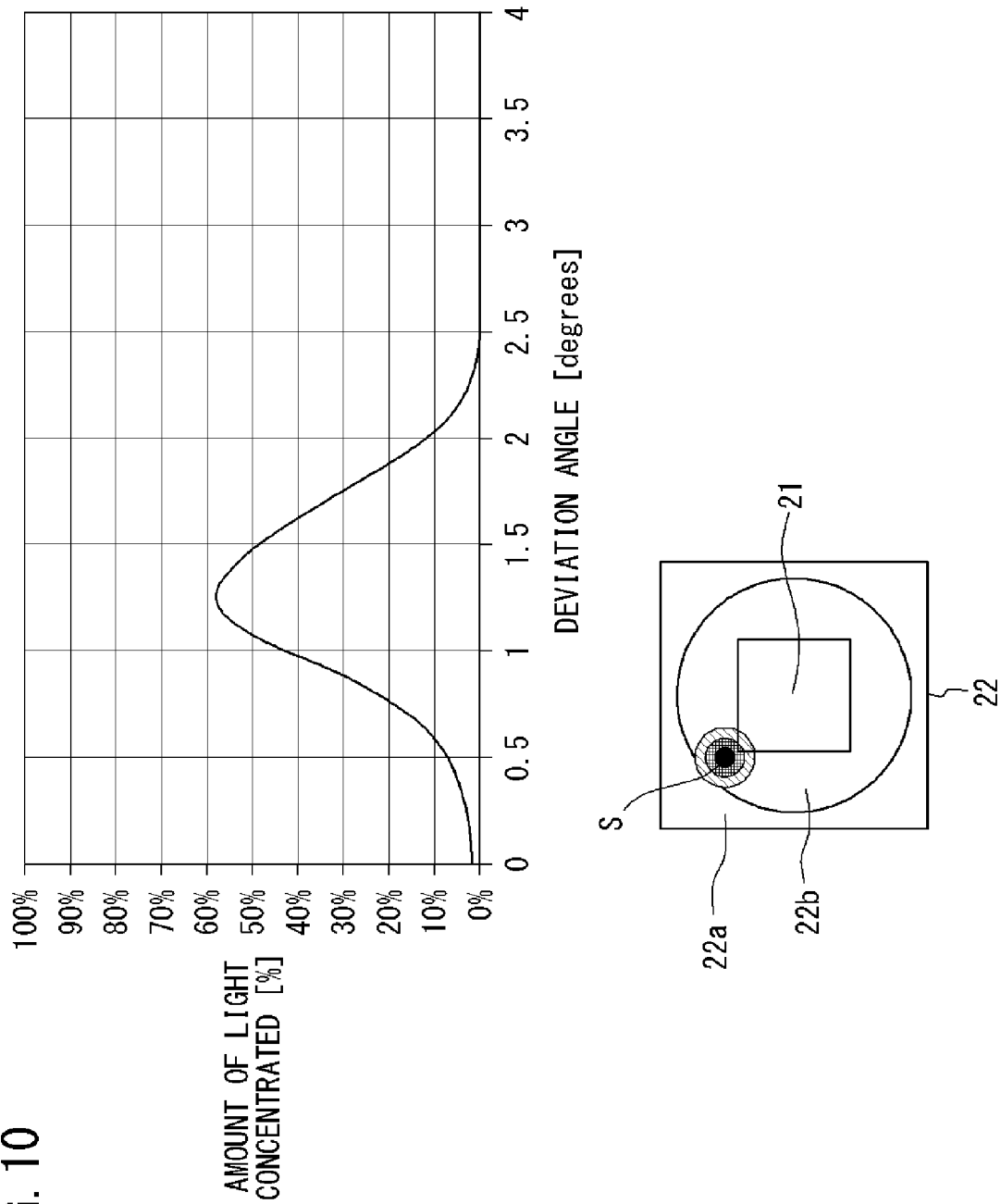
FIG. 10 shows, for the purpose of comparison, a graph showing the relation between the incidence deviation angle [degrees] and the amount of light [%] (percentage in the entire amount of light) concentrated on the package, and a plan view showing how a light spot is formed, in a case where the protection plate is not provided.

FIG. 10 shows, for the purpose of comparison, a graph of the relation between the incidence deviation angle [degrees] and the amount of light [%] (percentage in the entire amount of light) concentrated on the package 22, and a plan view showing how a light spot S is formed, in a case where the protection plate 23 is not provided.

In this case, between the deviation angles of 1 and 1.5 degrees, the amount of light becomes the maximum, reaching as much as about 60%. At this time, the light spot S strikes the bottom portion 22b of the package across the frame portion 22a, causing degradation of the package 22.

Figure 11:
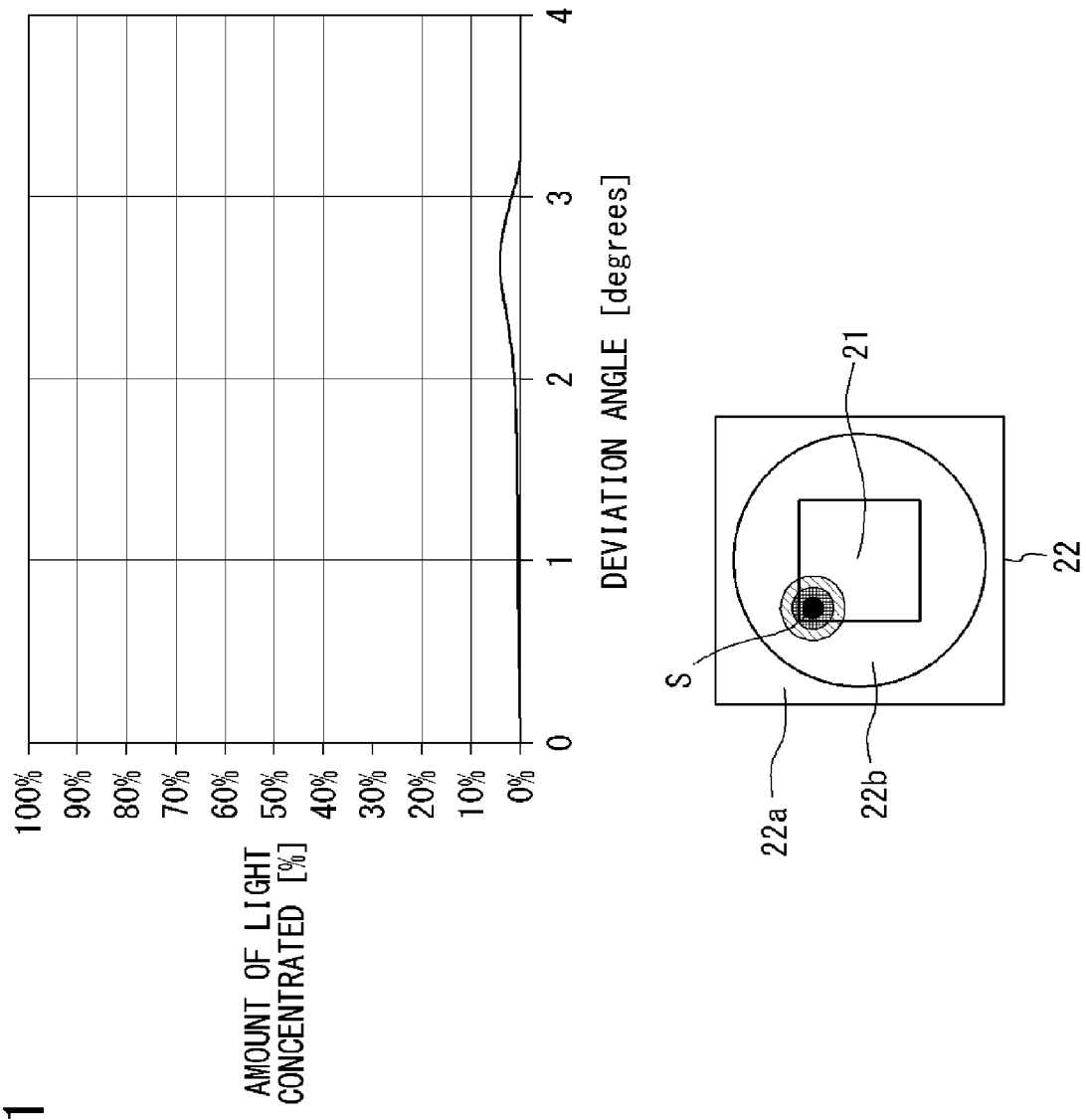
FIG. 11 shows a graph of the relation between the incidence deviation angle [degrees] and the amount of light [%] concentrated on the package, and a plan view showing how a light spot is formed, in a case where the protection plate is provided, according to the present embodiment.

FIG. 11 shows a graph of the relation between the incidence deviation angle [degrees] and the amount of light [%] concentrated on the package 22, and a plan view showing how the light spot S is formed, in a case where the protection plate 23 is provided, according to the present embodiment.

In this case, although a low peak is present between the deviation angles of 2 and 3 degrees, the amount of light is 5% or lower, and thus, degradation of the package 22 is suppressed. This is because the light spot S strikes the protection plate 23 and thus only slightly-leaking weak light strikes the package 22.

As described above, in the concentrator photovoltaic unit 1U having the above configuration, in a case where the incident angle of sunlight relative to the concentrating portion 13 has a deviation angle from 0 degrees, of light that has passed through the shield plate 15, the part that does not strike the cell 21 strikes the protection plate 23. Since the protection plate 23 is a heat-resistant member, the protection plate 23 can sufficiently endure the heat of converged light. In addition, since the protection plate 23 keeps a predetermined insulation distance from the live portion and is in an electrically suspended state because of being in contact with nothing but the frame portion, discharge from the live portion can be prevented. That is, the protection plate 23 is a highly practical member suitable for stable use.

Thus, it is possible to provide a highly practical structure that delays degradation, of the material in the vicinity of the cell 21, that could be caused when an incidence deviation angle has occurred.

The concentrator photovoltaic module 1M composed of the concentrator photovoltaic units 1U as described above, the concentrator photovoltaic panel 1 being an assembly of the modules, and the concentrator photovoltaic apparatus 100 which is provided with the concentrator photovoltaic panel 1 and the driving device 200 configured to drive the concentrator photovoltaic panel 1 so as to perform operation of tracking the movement of the sun while facing the direction of the sun each have a highly practical structure which delays degradation, of the material in the vicinity of each cell, that could be caused when the incidence angle has deviated from 0 degrees.

<<Others>>

The embodiment disclosed herein is to be considered in all aspects as illustrative but not restrictive. The scope of the present invention is indicated by the appended claims, and all changes that come within the meaning and range of equivalency of the claims are therefore intended to be embraced therein.

REFERENCE SIGNS LIST 1 concentrator photovoltaic panel
1M concentrator photovoltaic module
1U concentrator photovoltaic unit
3 pedestal
3a post
3b base
4 tracking sensor
5 pyrheliometer
11 housing
11a bottom surface
11b flange portion
12 flexible printed circuit
13 concentrating portion
13f Fresnel lens
14 connector
15 shield plate
15a opening
20 flexible printed substrate
20a pattern
20b insulation base material
21 cell
21a lead frame
22 package
22a frame portion
22b bottom portion
22c hole
23 protection plate
23a opening
23c projection
23t tapered surface
100 concentrator photovoltaic apparatus
200 driving device
201a stepping motor
201e stepping motor
202 drive circuit
300 electric power meter
400 control device
A optical axis
S light spot

What is claimed is:

1. A concentrator photovoltaic unit comprising:
   a concentrating portion configured to converge sunlight;
   a cell configured to receive light converged by the concentrating portion to generate power;
   a package including a frame portion, the frame portion having insulating property and surrounding the cell, the package being in integrated relation with the cell;
   a shield plate provided between the concentrating portion and the cell, and provided and spaced from a live portion of the cell by a predetermined insulation distance, and including an opening allowing light converged by the concentrating portion to selectively pass therethrough; and
   a protection plate provided between the shield plate and the cell, and provided and spaced from a live portion of the cell by a predetermined insulation distance, the protection plate being a heat-resistant member provided on the frame portion to make the cell expose to the light passed through the opening of the shield plate and to shield the package from the light, the protection plate being in direct and physical contact with nothing but the frame portion.

2. The concentrator photovoltaic unit according to claim 1, wherein
   the protection plate has an opening configured to expose the cell, and an inner end surface of the opening is a tapered surface formed such that an area of the opening on a light exit side is smaller than an area of the opening on a light entrance side.

3. The concentrator photovoltaic unit according to claim 1, wherein
   the protection plate is made of a metal or a ceramic.

4. The concentrator photovoltaic unit according to claim 2, wherein
   the protection plate is made of a metal or a ceramic.

5. The concentrator photovoltaic unit according to claim 2, wherein
   the protection plate is a resin plate whose surface is coated with a metal, or a ceramic plate whose surface is coated with a metal, a metal coating layer being formed at least on the tapered surface and a surface on which light strikes.

6. A concentrator photovoltaic module formed by arranging a plurality of the concentrator photovoltaic units according to claim 1 in a housing and by mutually electrically connecting the concentrator photovoltaic units.

7. A concentrator photovoltaic panel formed by arranging a plurality of the concentrator photovoltaic modules according to claim 6.

8. A concentrator photovoltaic apparatus comprising:
the concentrator photovoltaic panel according to claim 7; and
a driving device configured to drive the concentrator photovoltaic panel to thereby perform operation of tracking movement of the sun while facing a direction of the sun.

9. The concentrator photovoltaic unit according to claim 2, wherein
the opening of the shield plate is present inside positions where extension lines from slopes of the tapered surface cross the shield plate.

* * * * *